(12) United States Patent
Asakura (10) Patent No.: US 6,563,341 B2
(45) Date of Patent: May 13, 2003

(54) TRI-STATE BUFFER CIRCUIT

(75) Inventor: Toru Asakura, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/759,354

(22) Filed: Jan. 16, 2001

(65) Prior Publication Data

US 2002/0125912 A1 Sep. 12, 2002

(30) Foreign Application Priority Data

Jan. 21, 2000 (JP) ........................................ 2000-013098
Jan. 16, 2001 (JP) ........................................ 2001-007914

(51) Int. Cl.⁷ .......................................... H03K 19/094
(52) U.S. Cl. .............................. 326/58; 326/27; 326/57
(58) Field of Search .............................. 326/17, 27, 56, 326/57, 58

(56) References Cited

U.S. PATENT DOCUMENTS 5,519,344 A * 5/1996 Proebsting .................. 327/108
6,107,829 A * 8/2000 Martin ......................... 326/58
6,172,527 B1 * 1/2001 Doi .............................. 326/83

FOREIGN PATENT DOCUMENTS

JP 362108616 A * 5/1987 .................. 326/58

* cited by examiner

Primary Examiner—Daniel Chang
(74) Attorney, Agent, or Firm—Oliff & Berridge PLC (57) ABSTRACT

A small sized tri-state buffer circuit that realizes a higher integration of semiconductor integrated circuits is provided. The tri-state buffer circuit includes an AND device that obtains a logical product of an input signal IN and a control signal, inverts the logical product and outputs the same, a P-channel transistor having a gate that is supplied with a signal outputted from the AND device and a source that is supplied with a first power supply voltage, a first N-channel transistor that is complementarily connected with the P-channel transistor, and a second N-channel transistor that allows a current to flow from a source of the first N-channel transistor to a second power supply voltage according to the control signal.

5 Claims, 6 Drawing Sheets

⊗ Opening in interlayer dielectric layer

▨ Second wiring layer

▨ First wiring layer

▢ Polycrystal silicon

⌐ ¬ Impurity diffusion region

with the control signal $\overline{OE}$ at high level is supplied to the gate

TRI-STATE BUFFER CIRCUIT

BACKGROUND OF THE INVENTION

1. Field of Invention

The present invention relates to a tri-state buffer circuit that is used for an output buffer circuit of a semiconductor integrated circuit, and more particularly to a tri-state buffer circuit that is suitable for high integration of semiconductor integrated circuits.

2. Description of Related Art

A tri-state buffer circuit is a buffer circuit that outputs one of three possible states. Among the three states, two of them are low impedance states, one of which is at high level and the other of which is at low level. The remaining one is a high impedance state. The tri-state buffer circuit is used, for example, when outputs of a plurality of logical circuits are transferred on one signal line.

Figure 4:
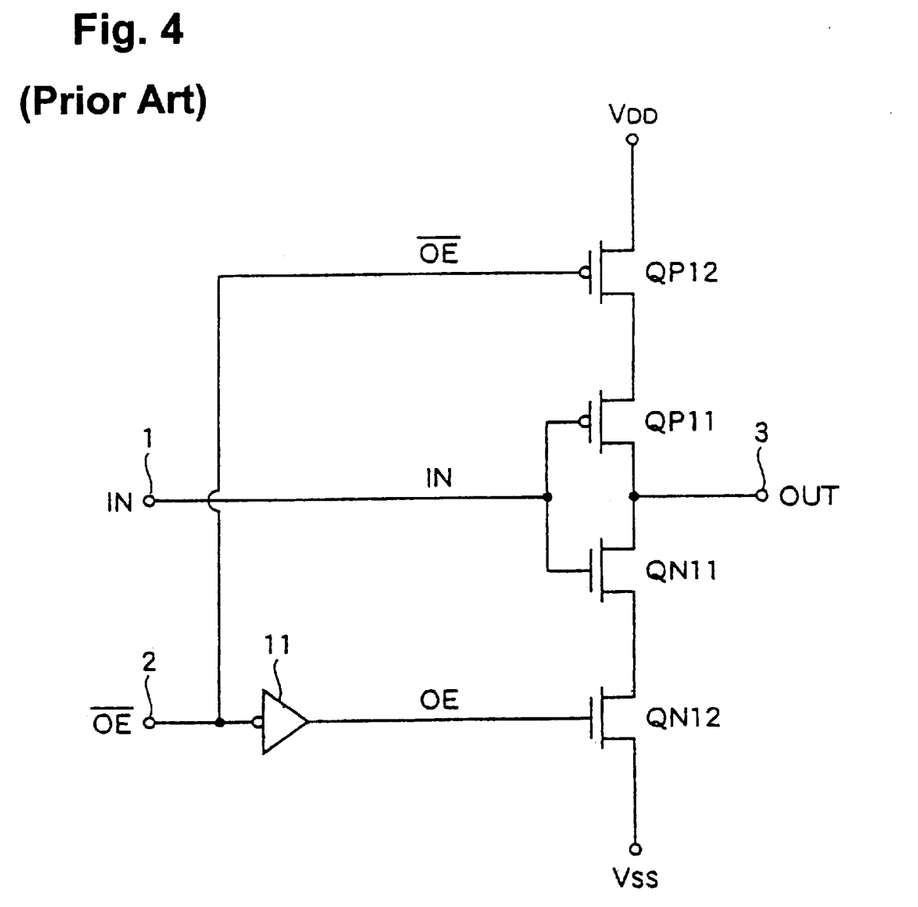
FIG. 4 shows a circuit diagram of the configuration of a conventional tri-state buffer circuit.

FIG. 4 shows a circuit diagram of the configuration of a conventional tri-state buffer circuit. As shown in FIG. 4, the tri-state buffer circuit includes a P-channel transistor QP11 and an N-channel transistor QN11 that invert an input signal IN that is applied to a data input terminal 1 and output the inverted signal as an output signal OUT from a data output terminal 3, a P-channel transistor QP12 that is serially connected to the transistor QP11, an N-channel transistor QN12 that is serially connected to the transistor QN11, and an inverter circuit 11 that inverts a control signal $\overline{OE}$ and outputs a control signal OE.

The transistor QP12 performs switching between a first power supply voltage VDD and the transistor QP11 according to the control signal $\overline{OE}$ that is applied to a control terminal 2. On the other hand, the transistor QN12 performs switching between the transistor QN11 and a second power supply voltage $V_{SS}$ (normally, a grounding potential) according to the control signal OE that is outputted from the inverter circuit 11.

Next, an operation of the conventional tri-state buffer circuit shown in FIG. 4 is described. The operation of the tri-state buffer circuit is categorized into the following three operations depending on the state of the input signal IN that is applied to the data input terminal 1 and the state of the control signal $\overline{OE}$ that is applied to the control terminal 2. Each of the operations will be described below.

(1) A state in which the control signal $\overline{OE}$ is at low level, and the input signal IN is at low level.

The control signal $\overline{OE}$ at low level is supplied to a gate of the transistor QP12, thereby switching the transistor QP12 to an ON state. On the other hand, the inverter circuit 11 receives the control signal $\overline{OE}$ at low level, inverts the control signal $\overline{OE}$ and outputs a control signal OE at high level. The control signal OE at high level is supplied to a gate of the transistor QN12, which causes the transistor QN12 to switch to an ON state. Since the transistors QP12 and QN12 switch to an ON state, the transistors QP11 and QN11 operate as an inverter circuit, whereby the input signal IN at low level is inverted by the transistors QP11 and QN11, and an output signal OUT at high level is outputted from the data output terminal 3.

(2) A state in which the control signal $\overline{OE}$ is at low level, and the input signal IN is at high level Since the control signal $\overline{OE}$ is at low level, the transistors QP12 and QN12 switch to an ON state, in a similar manner as in (1) above. As a result, the transistors QP11 and QN11 operate as an inverter circuit, whereby the input signal IN at high level is inverted by the transistors QP11 and QN11, and an output signal OUT at low level is outputted from the data output terminal 3.

(3) A state in which the control signal $\overline{OE}$ is at high level

The control signal $\overline{OE}$ at high level is supplied to the gate of the transistor QP12, thereby switching the transistor QP12 to an OFF state. On the other hand, the inverter circuit 11 receives the control signal $\overline{OE}$ at high level, inverts the control signal $\overline{OE}$ and outputs a control signal OE at low level. The control signal OE at low level is supplied to the gate of the transistor QN12, thereby switching the transistor QN12 to an OFF state. Since the transistors QP12 and QN12 switch to an OFF state, the data output terminal 3 is placed in a high impedance state regardless of the state of the transistors QP11 and QN11, in other words, regardless of the state of the input signal IN.

As described above, in the conventional tri-state buffer circuit, when the control signal $\overline{OE}$ applied to the control terminal 2 is at low level, the data output terminal 3 outputs an output signal OUT having an inverted state of the input signal IN applied to the input terminal 1. Also, when the control signal $\overline{OE}$ inputted to the control terminal 2 is at high level, the data output terminal 3 is always placed in a high impedance state regardless of the state of the input signal IN applied to the input terminal 1. In this manner, the conventional tri-state buffer circuit can output one of three states including low impedance states, one of which is at high level and the other of which is at low level, and a high impedance state.

Figure 5:
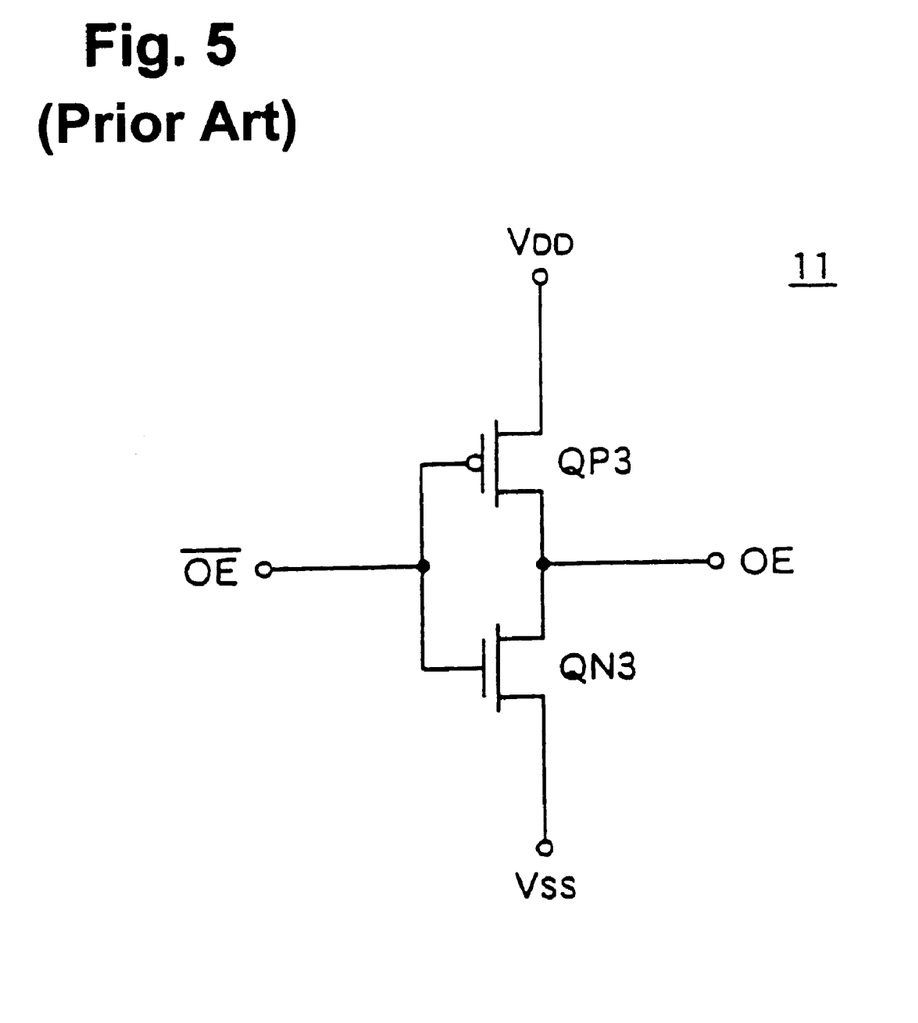
FIG. 5 shows a circuit diagram of the configuration of an inverter circuit that is used in the conventional tri-state buffer circuit shown in FIG. 4.

FIG. 5 shows a circuit diagram of the configuration of the inverter circuit 11 that is used in the conventional tri-state buffer circuit shown in FIG. 4. The inverter circuit 11 includes a P-channel transistor QP3 and an N-channel transistor QN3. When a signal at low level is inputted to the gates of the transistors QP3 and QN3, the transistor QP3 switches to an ON state, and the transistor QN3 switches to an OFF state, which causes drains of the transistors QP3 and QN3 to output a signal at high level. On the other hand, when a signal at high level is inputted to the gates of the transistors QP3 and QN3, the transistor QP3 switches to an OFF state, and the transistor QN3 switches to an ON state, which causes the drains of the transistors QP3 and QN3 to output a signal at low level. In this manner, the inverter circuit 11 inverts the control signal $\overline{OE}$ applied to the control terminal 2 and outputs the control signal OE.

Figure 6:
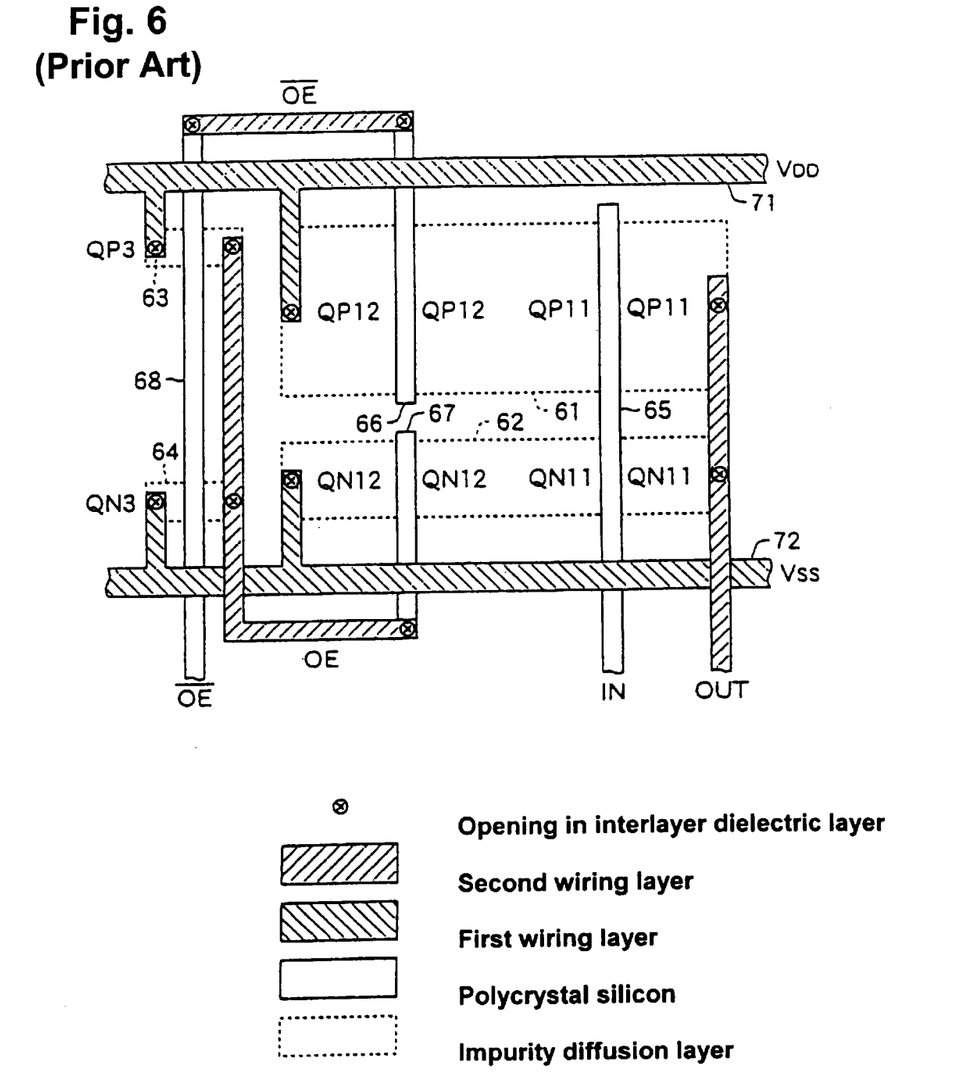
FIG. 6 shows an example of a layout of the conventional tri-state buffer circuit shown in FIG. 4.

FIG. 6 shows an example of a layout of the conventional ti-state buffer circuit shown in FIG. 4. As shown in FIG. 6, a semiconductor substrate includes therein a P-type impurity diffusion region 61 for the P-channel transistors QP11 and QP12 in the last stage, an N-type impurity diffusion region 62 for the N-channel transistors QN11 and QN12 in the last stage, a P-type impurity diffusion region 63 for the P-channel transistor QP3 of the inverter circuit, and an N-type impurity diffusion region 64 for the N-channel transistor QN3 of the inverter circuit.

A gate 65 of the transistors QP11 and QN11, a gate 66 of the transistor QP12, a gate 67 of the transistor QN12 and a gate 68 of the transistors QP3 and QN3 are formed of polycrystal silicon through a gate insulation layer over the semiconductor substrate where the impurity diffusion regions are formed. Furthermore, a first wiring layer including a first power supply wiring 71 and a second power supply wiring 72, and a second wiring layer including wirings between transistors are formed through an interlayer insulated layer. Openings are provided at specified sections of the interlayer insulated layer, in which portions of the first and second wiring layers are connected to the impurity diffusion regions, and other portions are connected to the polycrystal silicon.

Such a conventional tri-state buffer circuit needs a total of four transistors including two P-channel transistors and two N-channel transistors in the last stage. The current that flows in the last stage is substantially large, and therefore the sizes of the sources and drains of the four transistors need to be larger than the sizes of the sources and drains of normal transistors. For example, they may often become four times to ten times larger than the sizes of the sources and drains of the normal transistors. Moreover, a P-channel transistor has a transistor current amplification rate β lower than that of an N-channel transistor (for example, β of a P-channel transistor is about half that of an N-channel transistor), which requires a channel width that is about twice as large as that of the N-channel transistor in order to provide an output with an equal ON resistance.

Therefore, in the conventional tri-state buffer circuit shown in FIGS. 4–6, since two P-channel transistors of a larger size are needed in the last stage, the area occupied by these transistors in the semiconductor substrate increases, and this results in a problem in that a higher integration of a semiconductor integrated circuit is hindered. On the other hand, in recent years, much higher integration of semiconductor integrated circuits has become desirable.

SUMMARY OF THE INVENTION

In view of the problems described above, it is an object of the present invention to provide a smaller sized tri-state buffer circuit that can realize a high integration of a semiconductor integrated circuit.

To solve the problems described above, a tri-state buffer circuit in accordance with the present invention has an AND device that obtains a logical product of an input signal and a control signal, inverts the logical product and outputs the same; a P-channel transistor having a gate that is supplied with a signal outputted from the AND device and a source that is supplied with a first power supply voltage to output an output signal at the drain; a first N-channel transistor that is complementarily connected with the P-channel transistor, the first N-channel transistor having a gate that is supplied with a signal outputted from the AND device and a drain that outputs an output signal; and a second N-channel transistor connected between the first N-channel transistor and a second power supply voltage, wherein the second N-channel transistor has a gate that is supplied with the control signal and allows a current to flow from a source of the first N-channel transistor to the second power supply voltage according to the control signal.

The present invention is particularly effective when the size of source/drain of a P-channel transistor is four times or more greater than the size of source/drain of any of transistors used in the AND device. It is noted that the AND device may be a NAND circuit. Also, the tri-state buffer circuit may further include an inverter device that inverts an external control signal that is externally supplied, and outputs the inverted signal as the control signal.

In accordance with the present invention, the number of P-channel transistors that occupy a large area in a semiconductor substrate can be reduced from two as required in the conventional type to one, with the result that a tri-state buffer circuit having a smaller size than the conventional circuit can be realized.

DETAILED DESCRIPTION OF PREFERRED EMBODIMENTS

Preferred embodiments of the present invention are described with reference to the accompanying drawings. It is noted that the same elements are indicated with the same reference numbers, and their descriptions are not duplicated.

Figure 1:
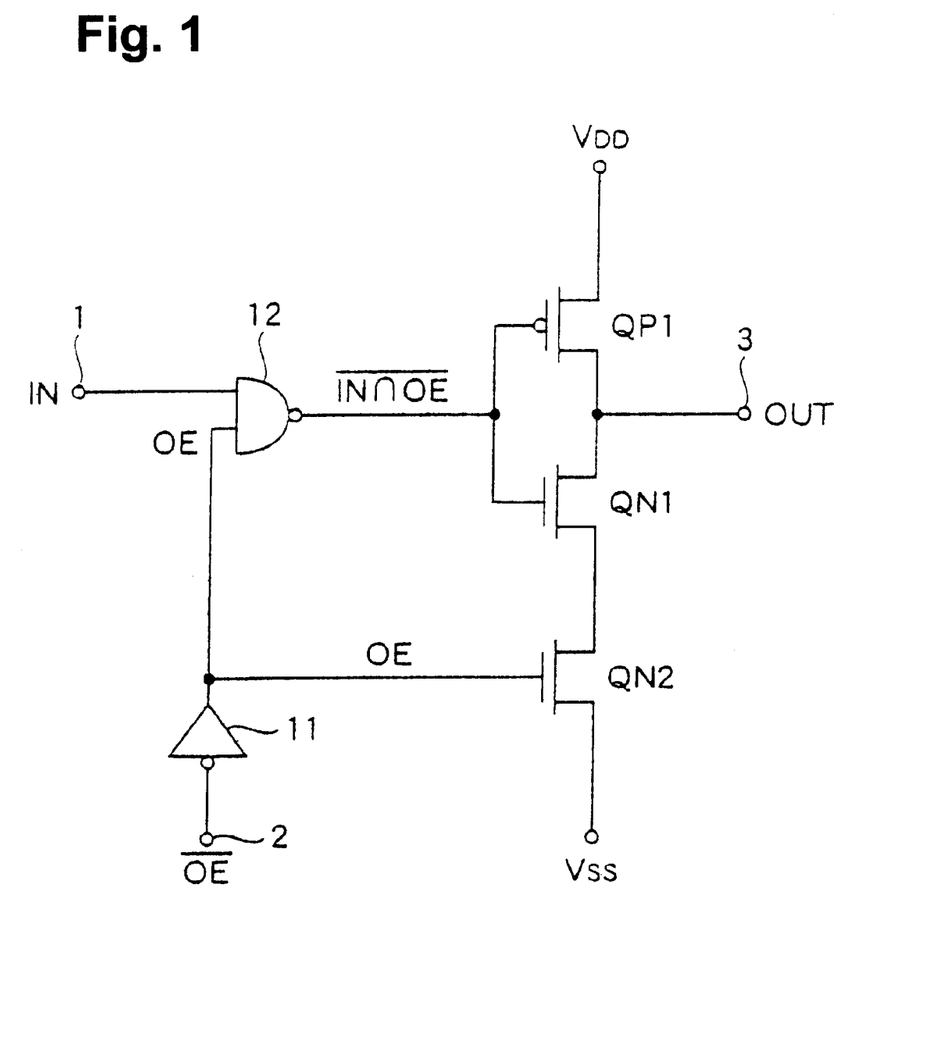
FIG. 1 shows a circuit diagram of the configuration of a tri-state buffer circuit in accordance with a first embodiment of the present invention.

FIG. 1 shows a circuit diagram of the configuration of a tri-state buffer circuit in accordance with a first embodiment of the present invention. As shown in FIG. 1, the tri-state buffer circuit includes an inverter circuit 11 that inverts a control signal $\overline{OE}$ applied to a control terminal 2 and outputs a control signal OE, a NAND circuit 12 that obtains a logical product of an input signal IN applied to a data input terminal 1 and the control signal OE outputted from the inverter circuit 11, inverts the logical product and outputs the same, P-channel transistor QP1 and N-channel transistor QN1 that invert a signal outputted from the NAND circuit 12 and complementarily output the same as an output signal OUT from a data output terminal 3, and an N-channel transistor QN2 that is serially connected to the transistor QN1.

It is noted that a first power supply voltage $V_{DD}$ is supplied to a source of the transistor QP1. On the other hand, the transistor QN2 allows a current to flow from a source of the transistor QN1 to a second power supply voltage $V_{SS}$ (that is normally a grounding potential) according to the control signal OE to thereby perform switching. It is noted that the circuit configuration of the inverter circuit 11 is the same as the one shown in FIG. 5. Also, to simplify the comparison with the conventional technology, the description herein is made to the extent that the control signal $\overline{OE}$ that is externally supplied is a negative logic. However, the control signal that is externally supplied may not necessarily be a negative logic. When a control signal OE of a positive logic is externally supplied, the inverter circuit 11 does not need to be provided, and therefore the tri-state buffer circuit can be further reduced in size.

Next, an operation of the tri-state buffer circuit shown in FIG. 1 is described. The operation of the tri-state buffer circuit is categorized into the following three operations depending on the state of the input signal IN that is inputted to the data input terminal 1 and the state of the control signal $\overline{OE}$ that is inputted in the control terminal 2. Each of the operations will be described below.

(1) A state in which the control signal $\overline{OE}$ is at low level, and the input signal IN is at low level.

The inverter circuit 11 receives the control signal $\overline{OE}$ at low level from the control terminal 2, inverts the control signal $\overline{OE}$ and outputs a control signal OE at high level. The control signal OE at high level is supplied to one of two input terminals of the NAND circuit 12 and to a gate of the transistor QN2, and accordingly, the transistor QN2 switches to an ON state. The other input terminal of the NAND circuit 12 is supplied with an input signal IN at low level from the data input terminal 1. Therefore, the NAND circuit 12 outputs a signal at high level. Since the transistor QN2 switches to an ON state, the transistors QP1 and QN 1 operate as an inverter circuit, whereby the signal at high level outputted from the NAND circuit 12 is inverted by the transistors QP1 and QN1, and an output signal OUT at low level is outputted from a data output terminal 3.

(2) A state in which the control signal $\overline{OE}$ is at low level, and the input signal IN is at high level Since the control signal $\overline{OE}$ is at low level, the transistor QN2 switches to an ON state, in a similar manner as in (1) above. An input signal IN at high level is supplied from the data input terminal 1 to the other input terminal of the NAND circuit 12. Therefore, the NAND circuit 12 outputs a signal at low level. Since the transistor QN2 switches to an ON state, the transistors QP1 and QN1 operate as an inverter circuit, whereby the signal at high level outputted from the NAND circuit 12 is inverted by the transistors QP1 and QN1, and an output signal OUT at high level is outputted from the data output terminal 3.

(3) A state in which the control signal $\overline{OE}$ is at high level

The inverter circuit 11 receives the control signal $\overline{OE}$ at high level, inverts the control signal $\overline{OE}$ and outputs a control signal OE at low level. The control signal OE at low level is supplied to one input terminal of the NAND circuit 12 and a gate of the transistor QN2. Therefore, the transistor QN2 switches to an OFF state. Since the control signal OE at low level is supplied to the one input terminal of the NAND circuit 12, the NAND circuit 12 outputs a signal at high level regardless of the level of the input signal IN that is supplied from the data input terminal 1 to the other input terminal of the NAND circuit 12. The transistor QP 1 is supplied at its gate with a signal at high level and therefore switches to an OFF state, and the transistor QN2 also switches to an OFF state, which causes the data output terminal 3 to switch to a high impedance state.

In the manner described above, in the tri-state buffer circuit in accordance with the embodiment of the present invention, when the control signal $\overline{OE}$ inputted to the control terminal 2 is at low level, the data output terminal 3 outputs an output signal OUT having the same state as that of the input signal IN inputted to the data input terminal 1. Also, when the control signal $\overline{OE}$ inputted to the control terminal 2 is at high level, the data output terminal 3 is always placed in a high impedance state regardless of the state of the input signal IN inputted to the data input terminal 1. In this manner, the tri-state buffer circuit of the present embodiment can also output one of three states including low impedance states, one of which is at high level and the other of which is at low level, and a high impedance state, in a similar manner as the conventional tri-state buffer circuit.

Figure 2:
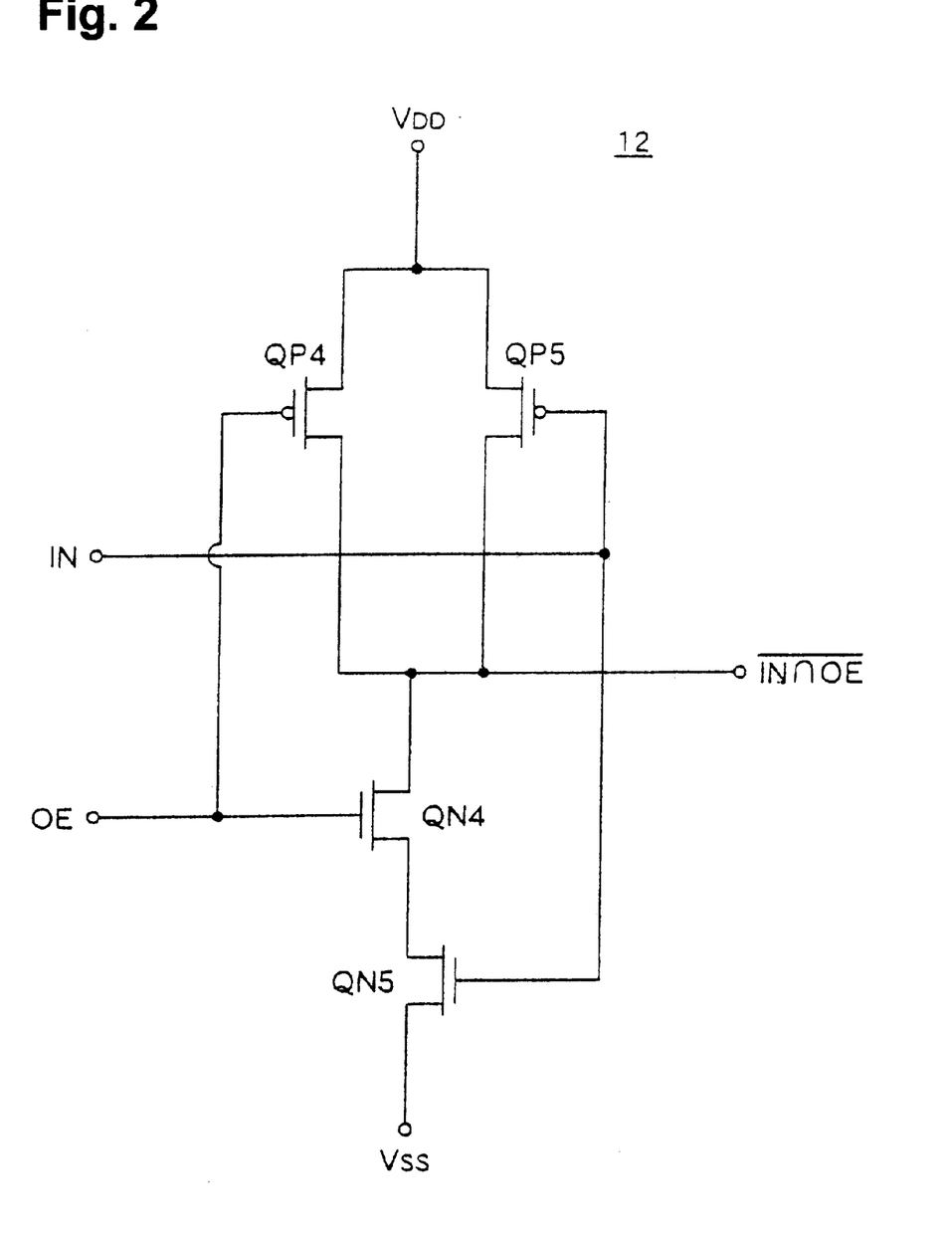
FIG. 2 shows a circuit diagram of the configuration of a NAND circuit that is used in the tri-state buffer circuit shown in FIG. 1.

FIG. 2 shows a circuit diagram of the configuration of the NAND circuit 12 that is used in the tri-state buffer circuit shown in FIG. 1. The NAND circuit 12 includes P-channel transistors QP4 and QP5 and N-channel transistors QN4 and QN5. When a signal at high level is inputted to gates of the transistors QP4, QP5, QN4 and QN5, in other words, when an input signal IN is at high level and a control signal OE is also at high level, the transistors QP4 and QP5 switch to an OFF state, and the transistors QN4 and QN5 switch to an ON state, which causes drains of the transistors QP4, QP5 and QN4 to output a signal at low level.

Next, when an input signal IN is at low level and a control signal OE is also at low level, the transistors QP4 and QP5 switch to an ON state, and the transistors QN4 and QN5 switch to an OFF state, which causes the drains of the transistors QP4, QP5 and QN4 to output a signal at high level.

When an input signal IN is at low level and a control signal OE is at high level, the transistor QP4 switches to an OFF state, the transistor QP5 switches to an ON state, the transistor QN4 switches to an ON state, and the transistor QN5 switches to an OFF state. As a result, the drains of the transistors QP4, QP5 and QN4 output a signal at high level.

Furthermore, when an input signal IN is at high level and a control signal OE is at low level, the transistor QP4 switches to an ON state, the transistor QP5 switches to an OFF state, the transistor QN4 switches to an OFF state, and the transistor QN5 switches to an ON state. As a result, the drains of the transistors QP4, QP5 and QN4 output a signal at high level.

In this manner, the NAND circuit 12 obtains a logical product of an input signal IN applied to the input terminal 1 and a control signal OE outputted from the inverter circuit 11, inverts the logical product and outputs the same.

Figure 3:
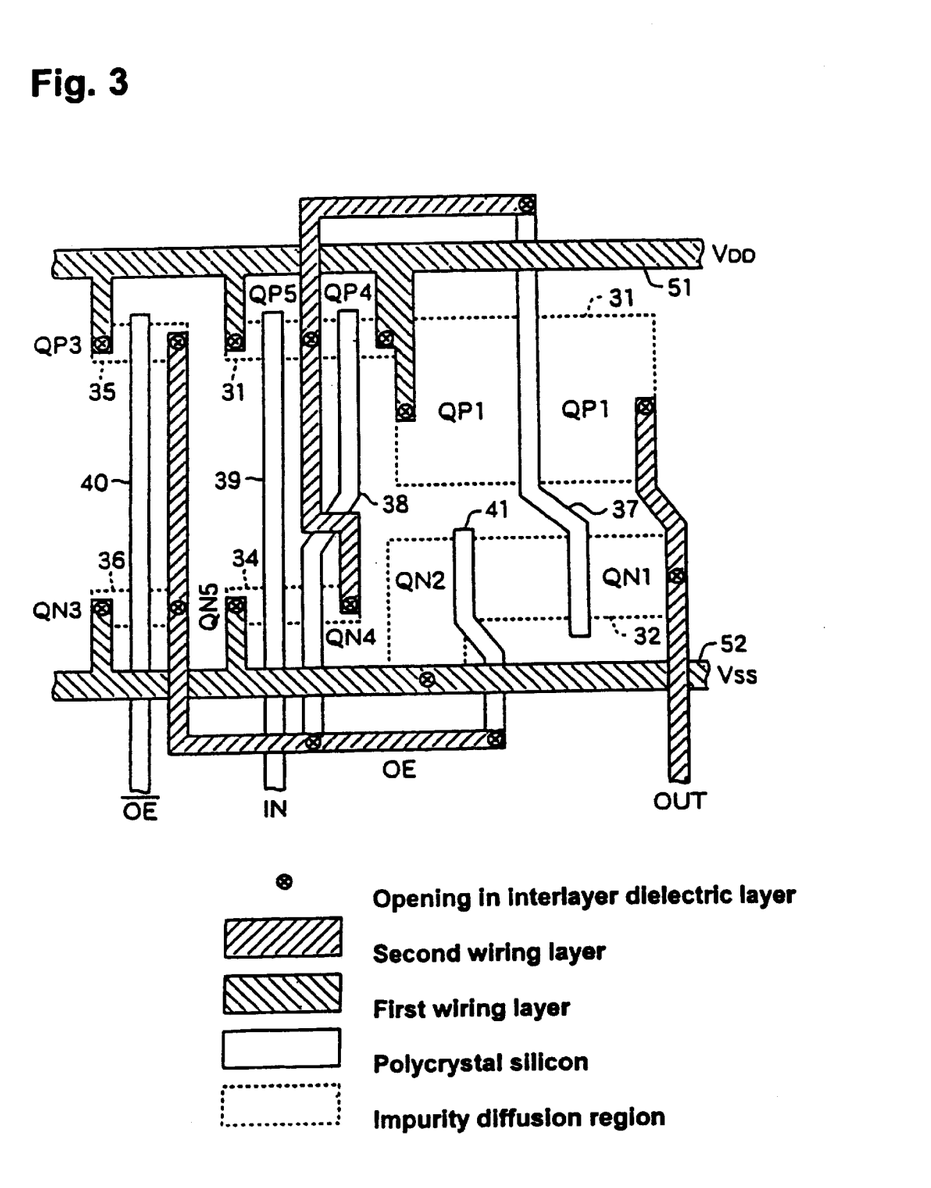
FIG. 3 shows an example of a layout of the tri-state buffer circuit shown in FIG. 1.

FIG. 3 shows an example of a layout of the tri-state buffer circuit of the present invention shown in FIG. 1. Referring to FIG. 3, a semiconductor substrate includes therein a P-type impurity diffusion region 31 for the P-channel transistor QP 1 in the last stage, an N-type impurity diffusion region 32 for the N-channel transistors QN1 and QN2 in the last stage, a P-type impurity diffusion region 31 for the P-channel transistors QP4 and QP5 that are included in the NAND circuit, an N-type impurity diffusion region 34 for the N-channel transistors QN4 and QN5 that are included in the NAND circuit, a P-type impurity difusion region 35 for the P-channel transistor QP3 that is inclided in the inveter circuit, and an N-type impurity diffusion region 36 for the N-channel transistor QN3 that is included in the inverter circuit.

A gate 37 of the transistors QP1 and QN1, a gate 41 of the transistor QN2, a gate 38 of the transistors QP4 and QN4, a gate 39 of the transistors QP5 and QN5, and a gate 40 of the transistors QP3 and QN3 are formed of polycrystal silicon through a gate insulation layer over the semiconductor substrate where the impurity diffusion regions are formed.

Furthermore, a first wiring layer that includes a first power supply wiring 51 and a second power supply wiring 52, and a second wiring layer that includes wirings between transistors are formed through an interlayer insulated layer. Openings are provided at specified sections of the interlayer insulated layer, in which portions of the first and second wiring layers are connected to the impurity diffusion regions, and other portions are connected to the polycrystal silicon.

The tri-state buffer circuit in accordance with the embodiment of the present invention only requires a total of three transistors, one P-channel transistor and two N-channel transistors. The current that flows in the last stage is substantially large, and therefore the sizes of the sources and drains of the three transistors need to be larger than the sizes of the sources and drains of ordinary transistors. For example, they may often become four times to ten times greater than the sizes of the sources and drains of the normal transistors. Moreover, a P-channel transistor has a transistor current amplification rate β lower than that of an N-channel transistor (for example, β of a P-channel transistor is about half of that of an N-channel transistor), and therefore requires a channel width that is about twice as large as that of the N-channel transistor in order to provide an output with an equal ON resistance. Accordingly, by reducing the P-channel transistors in the last stage by one, the area occupied by the transistors in the semiconductor substrate can be reduced compared to the conventional structure, even if four transistors for a NAND circuit are added.

By comparing FIG. 3 and FIG. 6, it is understood that the tri-state buffer circuit in accordance with the embodiment of the present invention is reduced in size compared to the conventional ti-state buffer circuit. When the size of the transistors in the last state is much larger, the size difference between the two becomes more significant.

Also, as described above, when a control signal OE of a positive logic is externally supplied, the inverter is not required. Accordingly, the transistors QP3 and QP4 that form the inverter do not need to be provided. In this case, the area occupied by the transistors in the semiconductor substrate is further reduced.

As described above, in accordance with the present invention, since the number of the P-channel transistors in the last stage, which occupy a large area in the semiconductor substrate, can be reduced from two as required in the conventional structure to one, the tri-state buffer circuit having a smaller size compared to the conventional structure can be provided. As a result, a higher integration of semiconductor integrated circuits can be achieved.

What is claimed is:

1. A tri-state buffer circuit that outputs one of three possible states, the tri-state buffer circuit comprising:

an AND device that obtains a logical product of an input signal and a control signal, inverts the logical product and outputs the same, the AND device including at least a first P-channel transistor;

a second P-channel transistor having a gate that is supplied with a signal outputted from the AND device and a source that is supplied with a first power supply voltage;

a first N-channel transistor that is complementarily connected with the second P-channel transistor, the first N-channel transistor having a gate that is supplied with a signal outputted from the AND device and a drain that outputs an output signal; and a second N-channel transistor connected between the first N-channel transistor and a second power supply voltage, the second N-channel transistor has a gate that is supplied with the control signal and allows a current to flow from a source of the first N-channel transistor to the second power supply voltage according to the control signal, and the first P-channel transistor and the second P-channel transistor are formed on the same impurity diffusion region.

2. The tri-state buffer circuit according to claim 1, the AND device being a NAND circuit.

3. The tri-state buffer circuit according to claim 2, further comprising an inverter device that inverts an external control signal that is externally supplied, and outputs the inverted signal as the control signal.

4. The tri-state buffer circuit according to claim 1, further comprising an inverter device that inverts an external control signal that is externally supplied, and outputs the inverted signal as the control signal.

5. The tri-state buffer circuit according to claim 1, the source/drain of the second P-channel transistor has a size four time or more greater than a size of source/drain of any of the transistors used in the AND device.

* * * * *